US008642366B2

(12) United States Patent
Takagi

(10) Patent No.: US 8,642,366 B2
(45) Date of Patent: Feb. 4, 2014

(54) METHOD FOR FABRICATING GROUP-III NITRIDE SEMICONDUCTOR LASER DEVICE

(75) Inventor: Shimpei Takagi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 1 day.

(21) Appl. No.: 13/567,283

(22) Filed: Aug. 6, 2012

(65) Prior Publication Data

US 2013/0065337 A1 Mar. 14, 2013

(30) Foreign Application Priority Data

Sep. 13, 2011 (JP) ................ P2011-199677

(51) Int. Cl.
*H01L 21/00* (2006.01)
(52) U.S. Cl.
USPC ............................................... 438/33
(58) Field of Classification Search
USPC ............................................... 438/33, 46
See application file for complete search history.

(56) References Cited

U.S. PATENT DOCUMENTS

| 5,785,225 A * | 7/1998 | Loomis ................ 225/96.5 |
| 6,048,747 A * | 4/2000 | Chakrabarti et al. ........ 438/33 |
| 2013/0065336 A1* | 3/2013 | Takagi ................ 438/33 |

* cited by examiner

*Primary Examiner* — William D Coleman
(74) *Attorney, Agent, or Firm* — Venable LLP; Michael A. Sartori

(57) ABSTRACT

A method for fabricating a group-III nitride semiconductor laser device having a semi-polar surface provides a laser cavity mirror which can reduce lasing threshold current. A support plate H tilts at an angle THETA from an m-axis toward a reference plane Ab defined by a direction PR of travel of the blade 5g and an a-axis in a c-m plane while the direction PR is being orthogonal to the front surface Ha of the support plate H. The blade 5g is positioned so as to be aligned to a plane which includes an intersection P1 between the endmost scribe mark 5b1 among a plurality of scribe marks 5b and the front surface 5a of the substrate product 5 and extends along the direction PR. In the case where the angle ALPHA defined ranges either from 71 to 79 degrees or from 101 to 109 degrees, the angle THETA then ranges from 11 to 19 degrees, and thereby the reference plane Ab along the direction PR extends along the c-plane orthogonal to the c-axis.

19 Claims, 9 Drawing Sheets

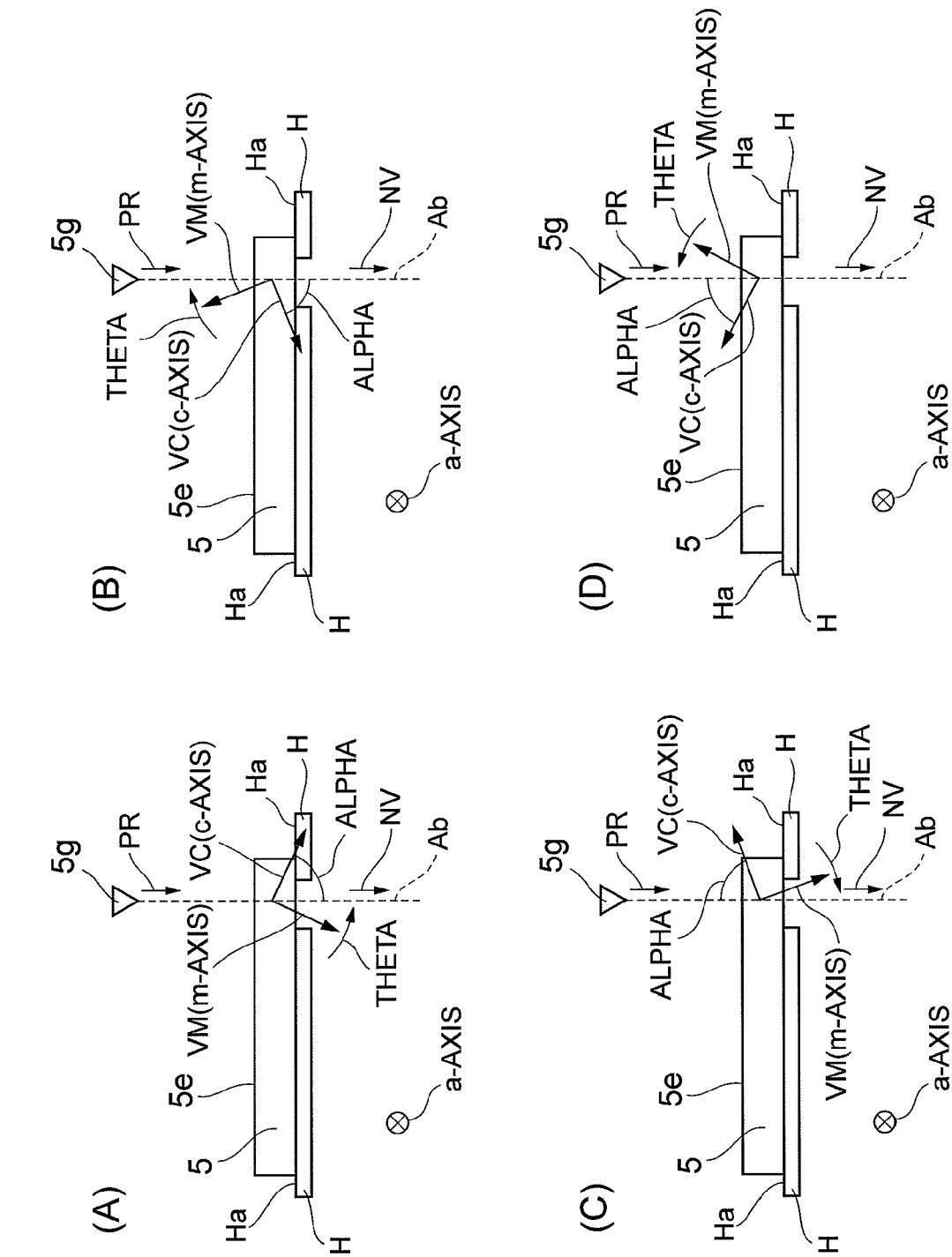

METHOD FOR FABRICATING GROUP-III NITRIDE SEMICONDUCTOR LASER DEVICE

BACKGROUND OF THE INVENTION

1. Technical Field

The present invention relates to a method for fabricating a group-III nitride semiconductor laser device.

2. Background Art

Patent Literature 1 (Japanese Unexamined Patent Application Publication No. 2011-3660) discloses a technology for a group-III nitride semiconductor laser device to achieve a low threshold current on a semi-polar surface of a support of the hexagonal group-III nitride. A c-axis of the hexagonal group-III nitride tilts toward an m-axis on the semi-polar surface. First and second fractured faces constituting as a laser cavity intersect the m-n plane. The group-III nitride semiconductor laser device includes a laser waveguide extending along an intersection line between the m-n plane and the semi-polar surface. The group-III nitride semiconductor laser device having such a structure can emit light causing an interband transition which can achieve a low threshold current. The first surface of the laser structure is opposite to the second surface. The first and second fractured faces extend from the edge of the first surface to the edge of the second surface. The formation of the first and second fractured faces does not involve dry-etching. The formation of the first and second fractured faces differs from conventional cleavage planes such as a c-plane, m-plane, and a-plane. Additionally, in association with technology to Patent Literature 1, a technology is known as is disclosed in Non Patent Literature 1 ("Semipolar (10-1-1) InGaN/GaN Laser Diodes on Bulk GaN Substrates", Anurag TYAGI, Hong ZHONG, Roy B. CHUNG, Daniel F. FEEZELL, Makoto SAITO, Kenji FUJITO1, James S. SPECK, Steven P. DENBAARS, and Shuji NAKAMURA, Japanese Journal of Applied Physics, Vol. 46, No. 19, 2007. pp. L444-L445).

SUMMARY OF THE INVENTION

As described in Patent Literature 1, in the case where a laser waveguide of the group-III nitride semiconductor laser device having a semi-polar surface extends along the semi-polar surface tilting from the c-plane toward the m-axis, laser cavity mirrors orthogonal to the laser waveguide are barely fabricated through any conventional cleavage method, and is thus fabricated by a fracturing method. The fracturing method for fabricating a laser cavity mirror is desired to provide a laser cavity mirror sufficiently suitable for a laser device, that is, to stably provide a resonance mirror which can reduce the lasing threshold current. The object of the present invention, which has been accomplished in view of such a circumstance, is to provide a method for fabricating a group-III nitride semiconductor laser device having a semi-polar surface, the method being capable of stably providing a laser cavity mirror which can reduce the lasing threshold current.

A method for fabricating a group-III nitride semiconductor laser device according to an aspect of the present invention comprising the steps of: preparing a substrate product having a substrate and a semiconductor region, the substrate comprising a hexagonal group-III nitride semiconductor and including a semi-polar principal surface, the semiconductor region provided on the semi-polar principal surface and including an active layer; scribing a first surface of the substrate product to form a plurality of scribe marks extending along an a-axis of the hexagonal group-III nitride semiconductor; and forming a laser bar and a substrate product residue from the substrate product with a cleaving system. The cleaving system has a support plate supporting the substrate product and a blade forced down through a second surface opposite to the first surface of the substrate product toward the support plate while the substrate product is being supported by the support plate. The support plate has a front surface, a back surface opposite to the front surface, and a space extending from the front surface to the back surface. The substrate product is placed on the front surface. The space extends in the direction orthogonal to a reference axis extending along the front surface of the support plate and defined by the support plate. The span of the space in the direction orthogonal to the reference axis is longer than the diameter of the first surface. The step of forming the laser bar and the substrate product residue comprises: fixing the substrate product on the support plate such that an endmost scribe mark among the plurality of scribe marks is located above the space and extends along the space; tilting the support plate at an angle THETA from an m-axis toward a reference plane defined by the direction of travel of the blade and the a-axis in a c-m plane defined by a c-axis and the m-axis of the hexagonal group-III nitride semiconductor while the direction of travel of the blade is being orthogonal to the front surface of the support plate; positioning the blade in the direction orthogonal to the a-axis such that the blade overlaps a plane including an intersection between the endmost scribe mark and the first surface and extending along the direction of travel of the blade; and forcing the blade down through the second surface of the substrate product. A portion of the second surface extends along the a-axis, and the blade is forced down through the portion of the second surface. A c-axis vector indicating the direction of the c-axis tilts at an angle ALPHA from a normal vector of the semi-polar principal surface. The angle ALPHA ranges either from 71 degrees to 79 degrees or from 101 degrees to 109 degrees. The angle THETA ranges from 11 degrees to 19 degrees. The laser bar extends from the first surface to the second surface, and has first and second end faces formed by the separation. The first and second end faces intersect the c-m plane. The first and second end faces function as a laser cavity of the group-III nitride semiconductor laser device.

According to the fabricating method, the support plate tilts at an angle THETA from the m-axis toward the reference plane defined by the direction of travel of the blade and the a-axis in the c-m plane while the direction of travel of the blade is being orthogonal to the front surface of the support plate. The blade is positioned in the direction orthogonal to the a-axis so as to overlap the plane which includes an intersection between the endmost scribe mark among the plurality of scribe marks and the front surface of the substrate product and extends along the direction of travel of the blade. In the case where the angle ALPHA defined by the c-axis vector and the normal vector of the semi-polar principal surface ranges either from 71 degrees to 79 degrees or from 101 degrees to 109 degrees, the angle THETA ranges from 11 to 19 degrees, and thereby the reference plane along the direction of travel of the blade extends along the c-plane orthogonal to the c-axis. Such a configuration enables the fracture along the c-plane. Accordingly, the first and second end faces of the laser bar separated by the downward force of the blade exhibit sufficient flatness and perpendicularity suitable for a laser cavity mirrors. The group-III nitride semiconductor laser device fabricated from the laser bar can reduce the lasing threshold current.

In the fabricating method, the scribe marks extend from the first surface toward the second surface along an a-n plane defined by the a-axis and the normal vector. Since the scribe marks are provided along the a-n plane, the faces of the laser bar separated by the blade extend along the a-n plane; hence, the faces are orthogonal to the c-m plane and can function as laser cavity mirrors. The scribe marks extending from the first surface toward the second surface facilitate the separation of the laser bar.

In the step of preparing the substrate product of the fabricating method, the substrate is subject to a process so as to have a thickness ranging from 50 μm to 100 μm. The process is one of slicing and grinding. The second surface is one of a processed surface formed by the process and a surface including an electrode formed on the processed surface. The substrate thus has a high rigidity. Since the substrate is subject to a process such as slicing and grinding, the processed surface exhibits satisfactory flatness.

In the fabricating method, the scribing is conducted with a laser scriber, and the scribe marks include scribe grooves. The laser scriber can form accurate scribe marks. The scribe marks including scribe grooves facilitate the separation of the laser bar.

In the fabricating method, the semi-polar principal surface tilts at an angle ranging from −4 degrees to +4 degrees from a semi-polar plane corresponding to any one of {20-21} and {20-2-1} planes toward an m-plane. Accordingly, the fabricating method can be applied to a substrate product having a semi-polar plane tilting at an angle ranging from −4 degrees to +4 degrees from any one of {20-21} and {20-2-1} planes toward the m-plane.

In the fabricating method, the semi-polar principal surface corresponds to any one of {20-21} and {20-2-1} planes. Accordingly, the fabricating method can be applied particularly to a substrate product having a semi-polar plane corresponding to any one of {20-21} and {20-2-1} planes.

In the fabricating method, the substrate includes any one of GaN, AlGaN, AlN, InGaN, and InAlGaN. The substrate includes such a nitride semiconductor.

In the fabricating method, end faces of the active layer in the first and second end faces tilt at an angle ranging from (ALPHA−5) degrees to (ALPHA+5) degrees from an m-plane orthogonal to an m-axis of the substrate in the c-m plane. Accordingly, the first and second end faces can exhibit sufficient flatness and perpendicularity for laser cavity mirrors.

In the fabricating method, in a plane orthogonal to the c-m plane and the normal vector, end faces of the active layer tilt by an angle ranging from −5 degrees to +5 degrees from a plane orthogonal to the intersection line between the plane and the c-m plane. Accordingly, the end faces of the active layer exhibit sufficient flatness and perpendicularity for laser cavity mirrors.

BRIEF DESCRIPTION OF EMBODIMENT

FIG. 9 is a diagram illustrating the tilting state of a support according to an embodiment.

DESCRIPTION OF PREFERRED EMBODIMENT

Figure 1:
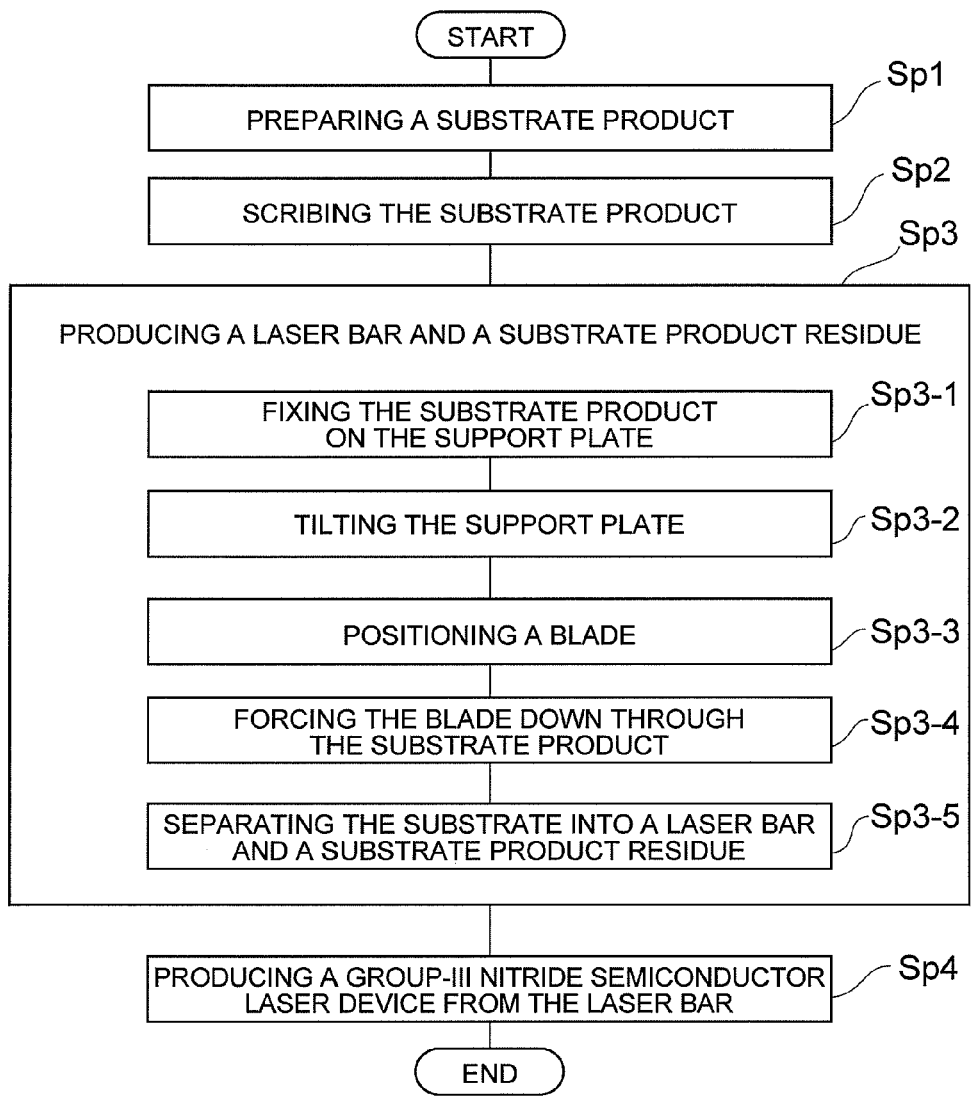
FIG. 1 is a flow chart illustrating main steps of a method for fabricating a group-III nitride semiconductor laser device according to an embodiment.
Figure 2:
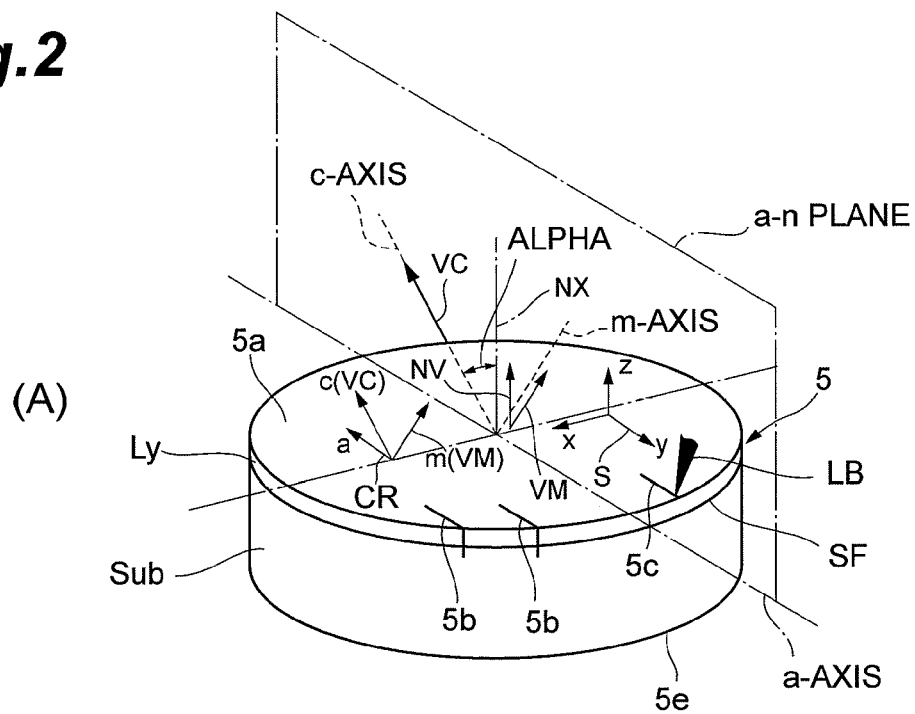
FIG. 2 is a diagram illustrating a method for fracturing a substrate product to fabricate a group-III nitride semiconductor laser device according to an embodiment.
Figure 2:
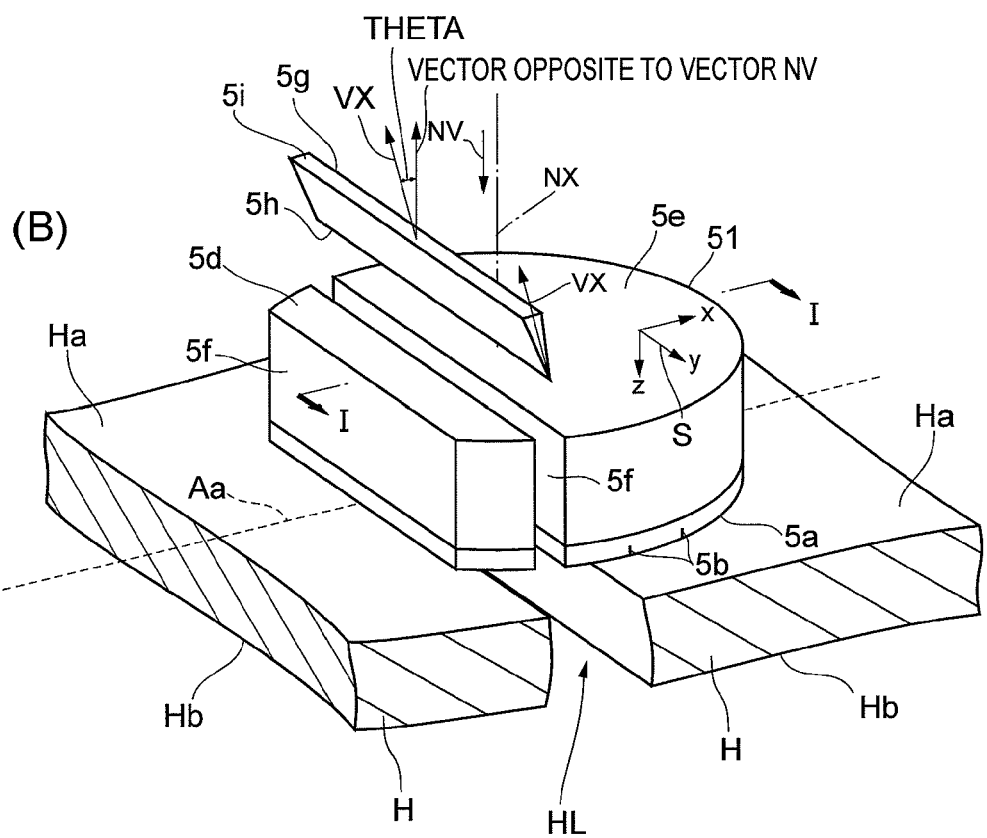

A preferred embodiment according to the present invention will now be described in detail with reference to the accompanying drawings. In the description of the drawings, the same numerals are assigned to the same components without duplicate explanation unless otherwise stated. The method according to an embodiment is for fabricating a group-III nitride semiconductor laser device. FIG. 1 is a flow chart illustrating the main steps of the method for fabricating a group-III nitride semiconductor laser device according to an embodiment. FIG. 2 illustrates a substrate product and a laser bar employed for fabricating of a group-III nitride semiconductor laser device.

(Step Sp1) A substrate product 5 illustrated in Part (A) of FIG. 2 is prepared. The substrate product 5 includes a laser structure of a hexagonal group-III nitride semiconductor, a p-side insulating film, a p-side electrode, and an n-side electrode. The p-side insulating film, the p-side electrode, and the n-side electrode are provided on the laser structure. The "p-side" corresponds to a side to which a p-type semiconductor region is aligned in the laser structure of the substrate product 5 of a hexagonal group-III nitride semiconductor. The "n-side" corresponds to a side to which an n-type semiconductor region is aligned in the laser structure of the substrate product 5 of a hexagonal group-III nitride semiconductor.

A group-III nitride semiconductor laser device 11 illustrated in FIG. 4, which is described below, is separated from the substrate product 5. The laser structure of the substrate product 5 of a hexagonal group-III nitride semiconductor is a wafer including a substrate Sub (corresponding to the support 17 of the group-III nitride semiconductor laser device 11) and a semiconductor region Ly (corresponding to the semiconductor region 19 of the group-III nitride semiconductor laser device 11).

The substrate Sub includes any one of GaN, AlGaN, AlN, InGaN, and InAlGaN. The substrate Sub has a semi-polar principal surface SF (corresponding to the semi-polar principal surface 17a of the group-III nitride semiconductor laser device 11) being a semi-polar surface of a hexagonal group-III nitride semiconductor.

The semi-polar principal surface SF tilts from a semi-polar plane corresponding to any one of {20-21} and {20-2-1} planes toward the m-plane of the hexagonal group-III nitride semiconductor of the substrate Sub at an angle ranging from −4 degrees to +4 degrees. The semi-polar principal surface SF may correspond to any one of {20-21} and {20-2-1} planes.

A semiconductor region Ly is epitaxially deposited on the semi-polar principal surface SF of the substrate Sub and is in contact with the semi-polar principal surface SF.

The substrate product 5 includes a p-side insulating film (corresponding to the insulating film 31 of the group-III nitride semiconductor laser device 11), a p-side electrode (corresponding to the p-side electrode 15 of the group-III nitride semiconductor laser device 11), and an n-side electrode (corresponding to an n-side electrode 41 of the group-III nitride semiconductor laser device 11). The p-side electrode is provided on the p-side surface 5a of the substrate product 5 (i.e., on a first surface and the surface of the p-side insulating film). The n-side electrode is provided on the surface of the substrate Sub so as to cover the surface of the substrate Sub. The surface of the n-side electrode serves as a back surface 5e (a second surface) of the substrate product 5.

The substrate Sub is subject to a process so as to have a thickness from 50 μm to 100 μm. Examples of the process include slicing and grinding. One of a processed surface formed by the process and a surface having the n-side electrode formed on the processed surface may serve as the back surface 5e of the substrate product 5.

A normal axis NX is the normal line of the semi-polar principal surface SF, the normal axis NX being vertical to the surface 5a of the substrate product 5. A normal vector NV extends in the direction of the normal axis NX of the semi-polar principal surface SF of the substrate Sub, the normal vector NV extending along the normal axis NX from the semi-polar principal surface SF towards the semiconductor region Ly. The normal vector NV is vertical to the surface 5a and the semi-polar principal surface SF. The normal axis NX and the normal vector NV are parallel to the z-axis of the orthogonal coordinate system S. The normal vector NV extends toward a z-direction. The surface 5a and the semi-polar principal surface SF are parallel to the x-y plane.

Part (A) of FIG. 2 illustrates a crystal coordinate system CR. A c-axis vector VC, which represents the c-axis direction of the hexagonal group-III nitride semiconductor of the substrate Sub, tilts at an angle ALPHA from the normal vector NV of the semi-polar principal surface SF. The angle ALPHA ranges either from 71 degrees to 79 degrees or from 101 degrees to 109 degrees. The angle ALPHA of an embodiment illustrated in Part (A) of FIG. 2 ranges from 71 degrees to degrees. The a-axis of the hexagonal group-III nitride semiconductor of the substrate Sub extends in the direction opposite to the direction of the y-axis. The c-axis of the hexagonal group-III nitride semiconductor of the substrate Sub, the c-axis vector VC representing the direction of the c-axis, the m-axis of the hexagonal group-III nitride semiconductor of the substrate Sub, the m-axis vector VM representing the direction of the m-axis, the normal axis NX, and the normal vector NV representing the direction of the normal axis NX may be each orthogonal to the y-axis (a-axis) and may be present in a z-x plane.

(Step Sp2) The surface 5a is scribed after Step Sp1. The scribing is conducted with a laser scriber. Scribe marks 5b are formed by the scribing. The scribe marks 5b extend from the surface 5a of the substrate product 5 toward the back surface 5e of the substrate product 5 along the a-n plane defined by the a-axis direction and the normal axis NX. The scribe marks 5b extend in the a-axis direction from the surface 5a to the semiconductor region Ly. The scribe marks 5b are formed, for example, at an edge of the substrate product 5. The scribe marks 5b include scribe grooves. The scribe marks 5b are formed on the surface 5a by the irradiation with the laser beam LB. In Part (A) of FIG. 2, two scribe marks 5b had been already formed and the formation of a scribe mark 5c with the laser beam LB is in process. The length of the scribe mark 5b is shorter than an intersection line between the a-n plane and the surface 5a, and the part of the intersection line is irradiated with the laser beam LB.

The substrate product 5 is fractured after Step Sp2 and thereby a laser bar 5d and a substrate product residue 51 are formed. Step Sp3 includes Step Sp3-1 to Step Sp3-5.

Figure 3:
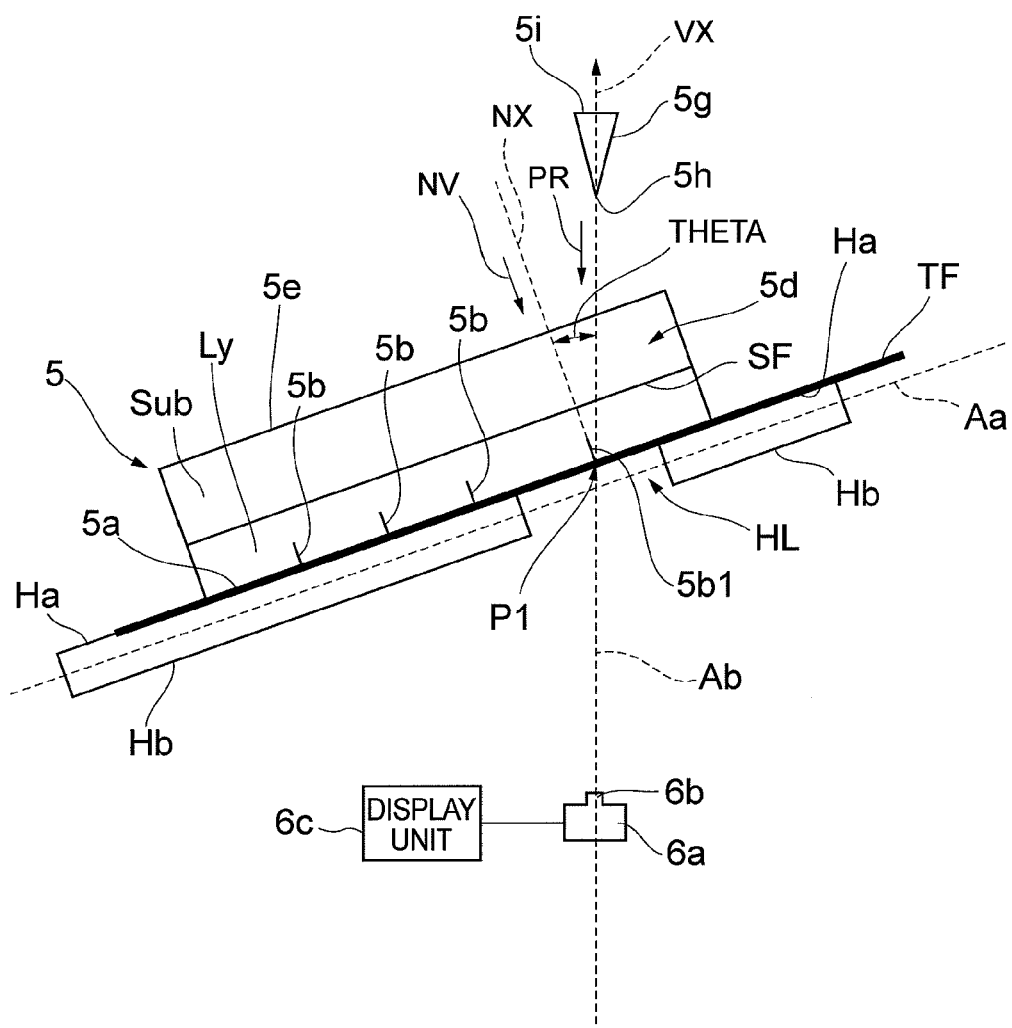
FIG. 3 is a diagram illustrating a method for fracturing a substrate product to fabricate a group-III nitride semiconductor laser device according to an embodiment, along with a cleaving system.

The substrate product 5 is fractured by a cleaving system. The cleaving system includes a support plate H, a blade 5g, a monitor camera 6a, and a display unit 6c as illustrated in Part (B) of FIG. 2 and FIG. 3. FIG. 3 is a cross-sectional view taken along the I-I line illustrated in Part (B) of FIG. 2. The laser bar 5d is separated from the substrate product in Part (B) of FIG. 2, while the laser bar 5d is not separated from the substrate product in FIG. 3. In Part (B) of FIG. 2, a protection sheet TF to protect the substrate product 5 illustrated in FIG. 3 is not depicted to simplify the description. An adhesive sheet to hold the substrate 5 is not depicted in Part (B) of FIG. 2 and FIG. 3.

The support plate H supports the substrate product 5. The support plate H has a front surface Ha, a back surface Hb, and a space HL. The substrate product 5 is provided on the front surface Ha. The back surface Hb is opposite to the front surface Ha. The space HL extends through the support plate H from the front surface Ha to the back surface Hb. The space HL extends in the direction orthogonal to a reference axis Aa defined by the support plate H and extending along the front surface Ha. The span of the space HL in the direction orthogonal to the reference axis Aa is longer than the diameter of the surface 5a of the substrate product 5. The blade 5g is forced down through the back surface 5e of the substrate product 5 toward the support plate H while the substrate product 5 is being supported by the support plate H.

As illustrated in FIG. 3, the blade 5g is disposed above the surfaces Ha of the support plate H, the monitor camera 6a is disposed below the back surfaces Hb of the support plates H, and the space HL is disposed therebetween. An axis direction vector VX representing the direction of the center axis of the blade 5g extends in the same direction as the direction from the lens 6b of the monitor camera 6a toward the edge 5h of the blade 5g. The axis direction vector VX represents the direction from the surface of the edge 5h to the opposite end face 5i of the blade 5g, and is orthogonal to the surface of the edge 5h and the end face 5i. The edge 5h extends in one direction (the y-axis direction and the a-axis direction of the substrate 5 in FIGS. 2 and 3).

The monitor camera 6a has the lens 6b. The monitor camera 6a is connected to the display unit 6c. The display unit 6c includes a display which displays images captured by the monitor camera 6a through the lens 6b. The blade 5g and the monitor camera 6a are in the fixed positions. The edge 5h of the blade 5g continually appears in the center of the display of the display unit 6c through the space HL while the substrate product 5 is not being disposed on the support plate H. The operator of the support plate H adjusts the position of the substrate product 5 to be disposed on the support plate H such that an intersection P1 between the surface 5a and the scribe mark 5b appears at the position of the edge 5h in the display, while monitoring the display unit 6c.

(Step Sp3-1) The substrate product 5 is disposed on the support plate H while the surface 5a of the substrate product 5 is being in contact with the support plate H as illustrated in Part (B) of FIG. 2. The substrate product 5 is fixed to the support plate H such that the endmost scribe mark (referred to as a scribe mark 5b1 in particular) among a plurality of scribe marks 5b is located above the space HL and extends along the space HL.

(Step Sp3-2) After Step Sp3-1, the support plate H in the position where the direction PR of travel of the blade 5g toward the back surface 5e is orthogonal to the front surface Ha of the support plate H, is tilting from the m-axis toward a reference plane Ab defined by the direction PR of travel of the blade 5g and the a-axis to define an angle THETA in the c-m plane defined by the c-axis and the m-axis. The m-axis defines an acute angle with the a-n plane in the direction from the m-axis toward the reference plane Ab. The direction PR of travel of the blade 5g toward the back surface 5e is opposite to the axis direction vector VX. The angle THETA ranges from 11 degrees to 19 degrees.

FIG. 9 illustrates support plates H tilting in specific direction in an embodiment. In FIG. 9, the direction PR of travel of the blade 5g toward the back surface 5e is orthogonal to the front surface Ha of the support plate H. The direction PR of travel of the blade 5g is parallel to the normal vector NV of the semi-polar principal surface SF. The reference plane Ab, which is defined by the direction PR of travel of the blade 5g and the a-axis, is parallel to the normal vector NV of the semi-polar principal surface SF. The angles ALPHA illustrated in FIGS. 9(A) and 9(B) ranges from 71 degrees to 79 degrees. The angles ALPHA illustrated in Part (C) and Part 9(D) of FIG. 9 ranges from 101 degrees to 109 degrees.

(Step Sp3-3) After Step Sp3-2, the blade 5g is positioned in the direction orthogonal to the a-axis (the direction along the c-m plane) so as to overlap the plane including an liner intersection P1 between the scribe mark 5b1 and the surface 5a and extending along the direction PR of travel of the blade 5g (which plane corresponding to the reference plane Ab including the intersection P1).

(Step Sp3-4) After Sp3-5, the blade 5g is forced down through the back surface 5e of the substrate product 5.

(Step Sp3-5) After Step Sp3-4, the substrate product 5 is fractured by the downward force of the blade 5g, which tilts at the angle THETA from the axis direction vector VX of the blade 5g toward the normal vector NV, onto the back surface 5e of the substrate product 5 to separate a laser bar 5d. The portion of the back surface 5e extends along the a-axis and the space HL, and the edge 5h of the blade 5g is forced down through the portion of the back surface 5e. The c-axis vector VC tilts at an angle of ALPHA from the normal vector NV of the semi-polar principal surface SF. Accordingly, the laser bar 5d is separated from the substrate product 5 by fracturing, and end faces 5f (also referred to as first and second end faces, and corresponding to fractured faces 27 and 29) formed by the separation of the laser bar 5d function as laser cavity mirrors of the semiconductor laser. The laser bar 5d includes the end face 5f formed by fracturing. The end face 5f extends from the front surface of the laser bar 5d (the surface 5a before fracturing) to the back surface of the laser bar 5d (the back surface 5e before fracturing).

The end faces 5f differ from cleavage planes such as a c-plane, m-plane, and a-plane. The end faces 5f are formed along the scribe marks 5b. The end faces 5f extend along the a-n plane. The end faces 5f constitute a laser cavity of the group-III nitride semiconductor laser device. The end faces 5f intersect the c-m plane. The end faces 5f having such a configuration exhibit sufficient perpendicularity and flatness for the resonance mirrors. The end faces of the active layer of the semiconductor region in the end faces 5f (end faces SE illustrated in FIG. 5) tilt at an angle ranging from (ALPHA−5) degrees to (ALPHA+5) degrees from the m-plane orthogonal to the m-axis of the substrate Sub in the c-m plane (a first surface) defined by the c-axis and the m-axis of the hexagonal group-III nitride semiconductor. The end face of the active layer (end face SE illustrated in FIG. 5) of the semiconductor region tilts by an off angle BETA ranging from −5 degrees to +5 degrees from a plane (plane Si illustrated in FIG. 5) orthogonal to the intersection line (intersection line LIX extending along a waveguide Id illustrated in FIG. 4) between the plane and the c-m plane in a surface (a second surface and a surface S2 illustrated in FIG. 5) orthogonal to the c-m plane and the normal vector NV (normal axis NX). FIG. 5 is a diagram illustrating off angle of end faces for explanation of advantages of a method for fabricating a group-III nitride semiconductor laser device according to an embodiment.

After the separation of at least one laser bar 5d from the substrate product 5, the substrate product residue 51 is formed. The above description about the substrate product 5 and the scribe mark 5b1 is also applied to the substrate product residue 51.

(Step Sp4) Next, a dielectric multilayer is provided on the end face 5f of the laser bar 5d to produce a laser bar product, and the laser bar product is then separated into individual group-III nitride semiconductor laser devices (corresponding to the group-III nitride semiconductor laser device 11). Accordingly, a group-III nitride semiconductor laser device is fabricated from the laser bar 5d.

As described above, the support plate H in the position where the direction PR of travel of the blade 5g is orthogonal to the front surface Ha of the support plate H tilts at the angle THETA from the m-axis toward the reference plane Ab defined by the direction PR and the a-axis in the c-m plane, and the blade 5g is positioned in the direction orthogonal to the a-axis so as to be aligned to the plane including an intersection line (the intersection P1) between the endmost scribe mark 5b1 among the plurality of scribe marks 5b and the surface 5a of the substrate product 5 and extending along the direction PR. In the case where the angle ALPHA defined by the c-axis vector VC and the normal vector NV of the semi-polar principal surface SF ranges either from 71 degrees to 79 degrees or from 101 degrees to 109 degrees, the angle THETA ranges from 11 degrees to 19 degrees, and thereby the reference plane Ab along the direction PR extends along the c-plane orthogonal to the c-axis, which enables the fracture along the c-plane. Accordingly, the end faces 5f of the laser bar 5d separated by the downward force of the blade 5g exhibit sufficient flatness and perpendicularity for a laser cavity mirrors. Accordingly, the group-III nitride semiconductor laser device 11 fabricated from the laser bar 5d can reduce the lasing threshold current Ith.

Since the scribe marks 5b are provided along the a-n plane, the faces of the laser bar 5d separated by the blade 5g extend along the a-n plane; hence the faces are orthogonal to the c-m plane and can function as laser cavity mirrors. The scribe marks 5b extending from the surface 5a toward the back surface 5e facilitate the separation of the laser bar 5d.

The substrate Sub has a thickness ranging from 50 μm to 100 μm so as to have a high rigidity. The substrate Sub is subject to a process such as slicing and grinding to provide the processed surface exhibiting sufficient flatness.

A laser scriber used for the scribing can form accurate scribe marks. The scribe marks including scribe grooves facilitate the separation of the laser bar 5d.

The fabricating method according to the embodiment can be applied to the substrate product 5 having the semi-polar principal surface SF tilting at an angle ranging from −4 degrees to +4 degrees from any one of {20-21} and {20-2-1} planes toward the m-plane.

The fabricating method according the embodiment can be applied particularly to the substrate product 5 having the semi-polar principal surface SF corresponding to any one of {20-21} and {20-2-1} planes.

The substrate Sub includes any one of GaN, AlGaN, AlN, InGaN, and InAlGaN. The substrate Sub includes such a nitride-based semiconductor.

The end faces of the active layer in the end face 5f tilt at an angle ranging from (ALPHA−5) degrees to (ALPHA+5) degrees from the m-plane in the c-m plane. Accordingly, the end face 5f can exhibit sufficient flatness and perpendicularity for laser cavity mirrors.

The end faces of the active layer of the substrate product 5 (end face SE illustrated in FIG. 5) tilt by an angle ranging from −5 degrees to +5 degrees from a plane (plane Si illustrated in FIG. 5) orthogonal to the intersection line between a surface (surface S2 illustrated in FIG. 5) and the c-m plane in the surface (surface S2 illustrated in FIG. 5) orthogonal to the c-m plane and the normal vector NV. Accordingly, the end faces of the active layer (end faces SE) exhibit sufficient flatness and perpendicularity suitable for laser cavity mirrors.

Next, the structure of the group-III nitride semiconductor laser device fabricated through the above-described steps Sp1 to Sp4 will now be described. FIG. 4 is a schematic view illustrating the structure of the group-III nitride semiconductor laser device 11 fabricated by the method according to the embodiment. The group-III nitride semiconductor laser device 11 has, but not limited to, a gain guided structure.

The normal axis NX is the normal line of a p-side surface 13a of the laser structure 13 (the normal line of the semi-polar principal surface 17a of the support 17) and extends toward the z-axis direction. The semi-polar principal surface 17a of the support 17 of the group-III nitride semiconductor laser device 11 extends in parallel to the x-y plane.

Figure 4:
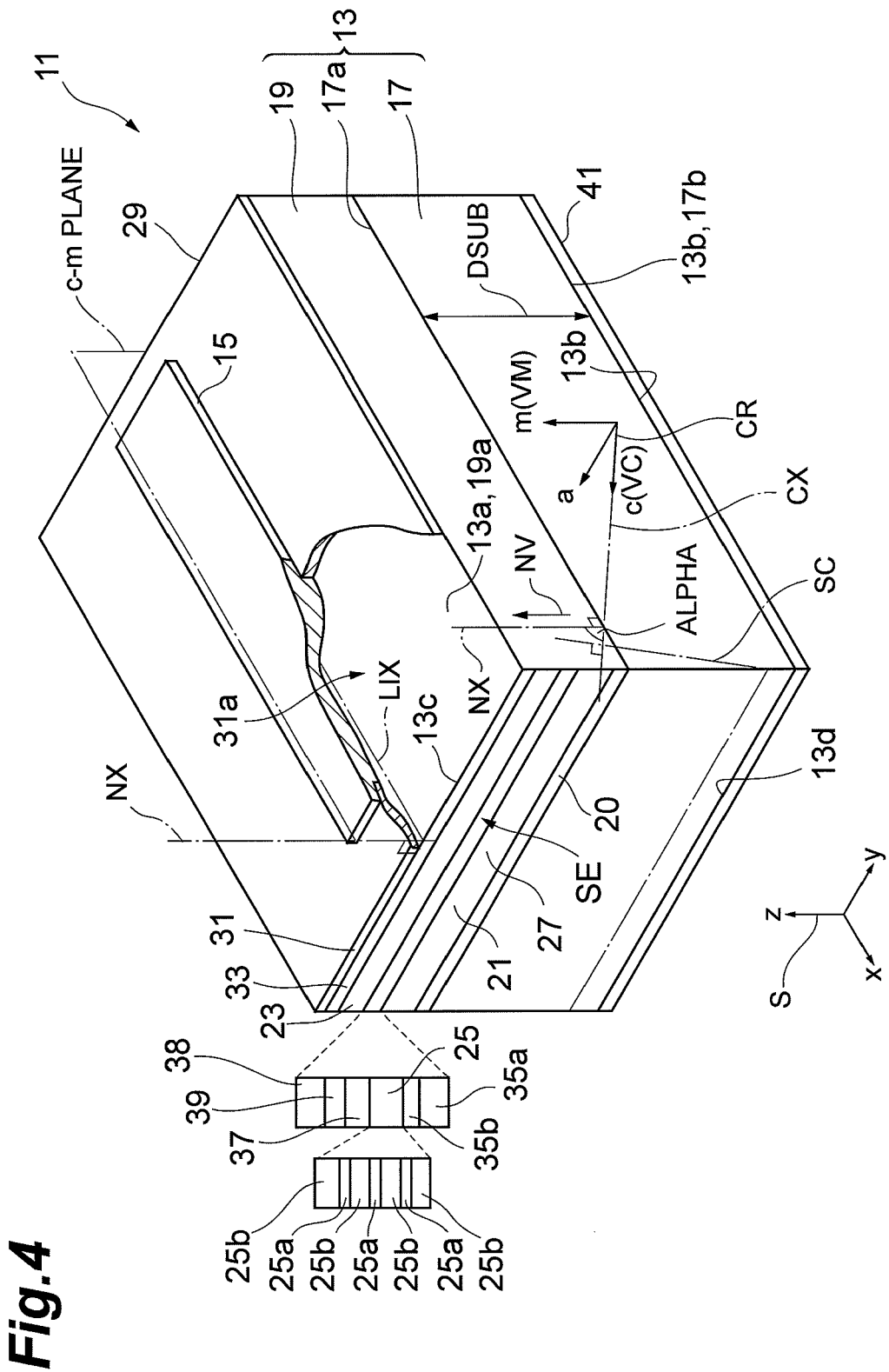
FIG. 4 is a diagram illustrating a structure of a group-III nitride semiconductor laser device fabricated by a method for fabricating a group-III nitride semiconductor laser device according to an embodiment.
Figure 5:
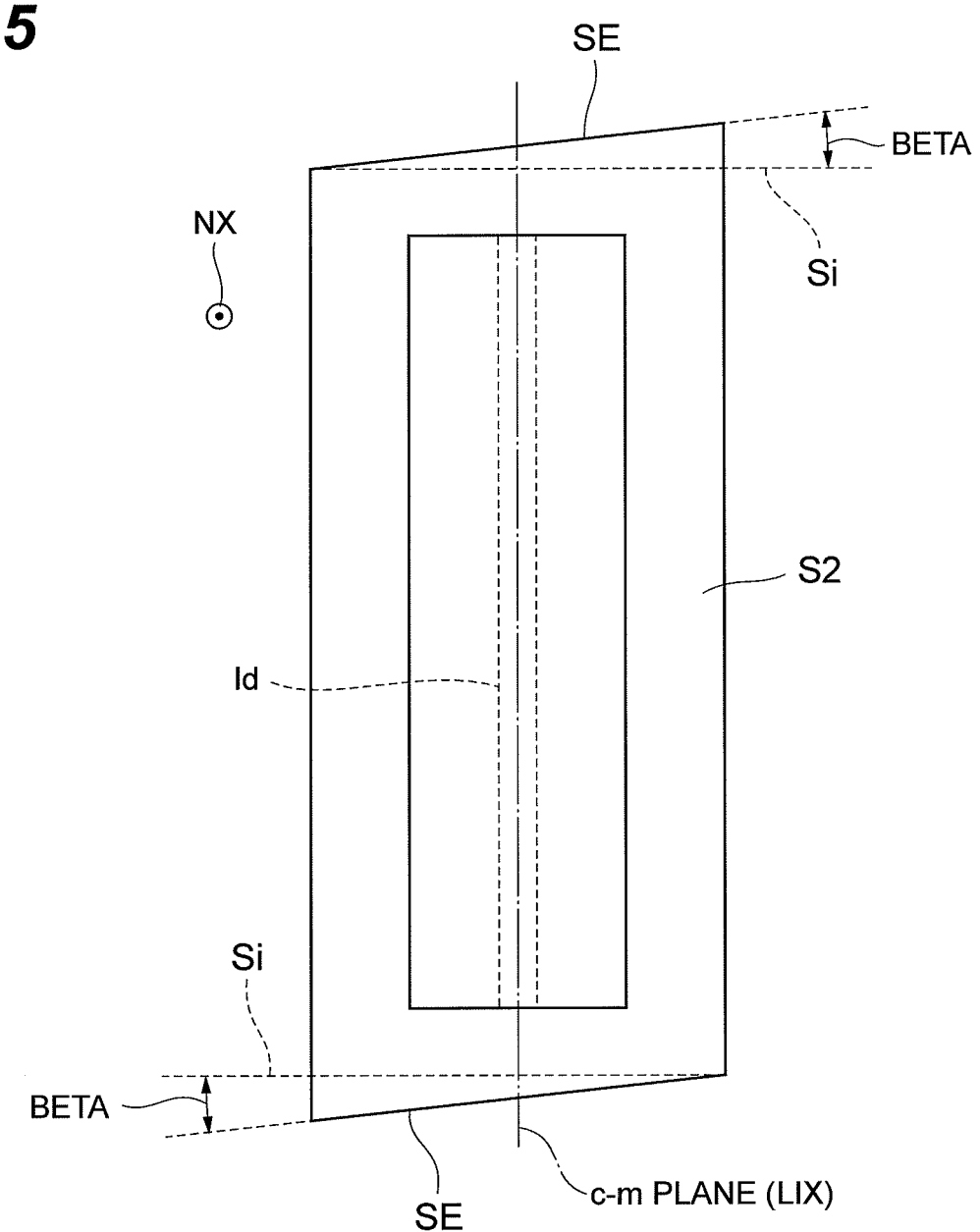
FIG. 5 is a diagram illustrating off angle of end faces for explanation of advantages of a method for fabricating a group-III nitride semiconductor laser device according to an embodiment.

FIG. 4 illustrates an exemplary c-plane SC. The c-axis of the hexagonal group-III nitride semiconductor of the support 17 corresponds to the axis CX. The c-axis (axis CX) tilts at a finite angle ALPHA from the normal axis NX toward the m-axis of the hexagonal group-III nitride semiconductor of the support 17. The c-axis vector VC and the normal vector NV define an angle ALPHA. The c-axis vector VC represents the direction of the c-axis. The normal vector NV extends along the normal axis NX and toward the p-side surface 13a of the laser structure 13, and is vertical to the surface 13a and the semi-polar principal surface 17a.

The angle ALPHA may range either from 71 degrees to 79 degrees or from 101 degrees to 109 degrees. The angle ALPHA illustrated in FIG. 4 ranges from 71 degrees to 79 degrees, but it may range from 101 degrees to 109 degrees.

A fractured faces 27 and 29 corresponding to the end faces 5f of the laser bar 5d intersect the c-m plane. The laser cavity of the group-III nitride semiconductor laser device 11 includes the fractured faces 27 and 29. A laser waveguide extends between the laser fractured face 27 and the fractured face 29. The laser cavity of the group-III nitride semiconductor laser device 11 has a height of, for example, approximately 600 μm.

The laser structure 13 includes the surface 13a and a back surface 13b, the surface 13a is opposite to the back surface 13b. The fractured faces 27 and 29 extend between the edge 13c of the surface 13a and the edge 13d of the back surface 13b. The fractured faces 27 and 29 are different from conventional cleavage planes such as a c-plane, m-plane, and a-plane.

In the group-III nitride semiconductor laser device 11, the fractured faces 27 and 29 constituting a laser cavity intersect the c-m plane. This allows the laser waveguide to extend along the intersection line between the c-m plane and the semi-polar principal surface 17a. Accordingly, the group-III nitride semiconductor laser device 11 includes a laser cavity which achieves a low threshold current.

The group-III nitride semiconductor laser device 11 includes a laser structure 13, an insulating film 31, an n-side electrode 41, and a p-side electrode 15. The laser structure 13 includes a support 17 and a semiconductor region 19. The support 17 comprises a hexagonal group-III nitride semiconductor. The support 17 has a semi-polar principal surface 17a and a back surface 17b. The support 17 has a thickness DSUB ranging from 50 μm to 100 μm. The support 17 includes any one of GaN, AlGaN, AlN, InGaN, and InAlGaN. The semi-polar principal surface 17a tilts from the semi-polar plane corresponding to any one of {20-21} and {20-2-1} planes toward the m-plane orientation at angle ranging from −4 degrees to +4 degrees. The semi-polar principal surface 17a may correspond to any one of {20-21} and {20-2-1} planes.

The semiconductor region 19 is provided over the semi-polar principal surface 17a of the support 17. The semiconductor region 19 includes a semiconductor layer 20, an n-side cladding layer 21, an n-side light guiding layer 35a, an n-side light guiding layer 35b, an active layer 25, a p-side light guiding layer 37, a p-side block layer 39, a p-side light guiding layer 38, a cladding layer 23, and a contact layer 33.

The semiconductor layer 20 is provided on the semi-polar principal surface 17a of the support 17. The semiconductor layer 20 comprises an n-type gallium nitride-based semiconductor (gallium nitride-based semiconductor: GaN-based semiconductor) such as an n-type GaN.

The n-side cladding layer 21 is provided on the semiconductor layer 20. The n-side cladding layer 21 comprises an n-type gallium nitride-based semiconductor such as n-type AlGaN and n-type InAlGaN.

The n-side light guiding layer 35a is provided on the n-side cladding layer 21. The n-side light guiding layer 35b is provided on the n-side light guiding layer 35a. The n-side light guiding layer 35a and the n-side light guiding layer 35b comprise, for example, one of GaN and InGaN.

The active layer 25 is provided between the n-side cladding layer 21 and the cladding layer 23. Specifically, the active layer 25 is provided between the n-side light guiding layer 35b and the p-side light guiding layer 37. The active layer 25 includes gallium nitride-based semiconductor layers, the gallium nitride-based semiconductor layers being, for example, well layers 25a. The active layer 25 includes barrier layers 25b of a gallium nitride-based semiconductor. The well layers 25a and the barrier layers 25b are alternately deposited. The well layers 25a comprise, for example, InGaN, while the barrier layers 25b comprise, for example, one of GaN and InGaN. The active layer 25 may include a quantum well structure to emit light having a wavelength ranging from 360 nm to 600 nm. The use of the semi-polar plane is preferred for emission of light having a wavelength ranging from 430 nm to 550 nm.

The p-side light guiding layer 37 is provided on the active layer 25. The p-side light guiding layer 37 is provided between the active layer 25 and the p-side block layer 39. The p-side light guiding layer 37 comprises an undoped gallium nitride-based semiconductor such as GaN and InGaN.

The p-side block layer 39 is provided between the p-side light guiding layer 37 and the p-side light guiding layer 38. The p-side block layer 39 comprises a p-type gallium nitride-based semiconductor such as p-type AlGaN.

The p-side light guiding layer 38 is provided on the p-side block layer 39. The p-side light guiding layer 38 is provided between the p-side block layer 39 and the cladding layer 23. The p-side light guiding layer 38 comprises a p-type gallium nitride-based semiconductor such as p-type GaN and p-type InGaN.

The cladding layer 23 is provided on the p-side light guiding layer 38. The cladding layer 23 is provided between the p-side light guiding layer 38 and the contact layer 33. The cladding layer 23 comprises a p-type gallium nitride-based semiconductor such as p-type AlGaN and p-type InAlGaN.

A contact layer 33 is provided on the cladding layer 23. The contact layer 33 comprises a p-type gallium nitride semiconductor, such as p-type GaN.

The semiconductor layer 20, the n-side cladding layer 21, the n-side light guiding layer 35a, the n-side light guiding layer 35b, the active layer 25, the p-side light guiding layer 37, the p-side block layer 39, the p-side light guiding layer 38, the cladding layer 23, and the contact layer 33 are aligned along a normal axis NX of the semi-polar principal surface 17a (the p-side surface 13a of the laser structure 13) in sequence.

The insulating film 31 and the p-side electrode 15 is provided over the p-side surface 19a of the semiconductor region 19 (the p-side surface 13a of the laser structure 13). The insulating film 31 covers the surface 19a of the semiconductor region 19, the semiconductor region 19 positioning between the insulating film 31 and the support 17. The insulating film 31 includes an opening 31a, the opening 31a extending along the intersection line LIX between the surface 19a of the semiconductor region 19 and the c-m plane, and having a shape of, for example, stripe. The p-side electrode 15 is in contact with the surface 19a of the semiconductor region 19 (or the contact layer 33) through the opening 31a, and extends along the intersection line LIX. The n-side electrode 41 is provided on the n-side back surface 13b of the laser structure 13 (or the back surface 17b of the support 17), and covers the back surface 13b (or the back surface 17b).

The insulating film 31 comprises, for example, $SiO_2$. The n-side electrode 41 comprises, for example, Ti/Al/Ti/Au. The p-side electrode 15 comprises, for example, Ni/Au. The group-III nitride semiconductor laser device 11 further includes a pad electrode. The pad electrode is connected to the p-side electrode 15, and comprises, for example, Ti/Al.

In the group-III nitride semiconductor laser device 11, the laser structure 13 includes fractured faces 27 and 29 intersecting the c-m plane. A laser waveguide of the group-III nitride semiconductor laser device 11 includes the n-side cladding layer 21, the cladding layer 23, and the active layer 25, and extends along the intersection line LIX. The end faces SE (see FIG. 5) of the active layer 25 respectively in the fractured faces 27 and 29 tilt by an angle ranging from (ALPHA−5) degrees to (ALPHA+5) degrees from the m-plane orthogonal to the m-axis of the support 17 in the c-m plane. The end faces SE of the active layer 25 tilt by an off angle BETA ranging from −5 degrees to +5 degrees from a plane Si orthogonal to the intersection line (or intersection line LIX extending along a waveguide Id illustrated in FIG. 5) between the surface S2 (or the surface 5a of the substrate product 5 illustrated in FIG. 5) and the c-m plane in the surface S2 orthogonal to the c-m plane and the normal axis NX.

In the group-III nitride semiconductor laser device 11, the support 17 has a thickness DSUB preferably of 400 µm or less so as to fabricate satisfactory fractured face for a laser cavity. In the group-III nitride semiconductor laser device 11, the thickness DSUB of the support 17 preferably ranges from 50 µm to 100 µm, which may facilitate handling of the device and increases production yield.

The semi-polar principal surface 17a may correspond to any one of {20-21} and {20-2-1} planes. The semi-polar principal surface 17a may be a plane which slightly tilts from any one of {20-21} and {20-2-1} planes at an angle ranging from −4 degrees to +4 degrees. Such a typical semi-polar principal surface 17a may provide fractured faces 27 and 29 exhibiting sufficient flatness and perpendicularity suitable for a laser cavity of the group-III nitride semiconductor laser device 11. Additionally, the plane tilting at such an angle in the typical plane orientations can exhibit sufficient flatness and perpendicularity.

The stacking fault density of the support 17 may be $1 \times 10^4$ $cm^{-3}$ or less. Such a support 17 having the stacking fault density of $1 \times 10^4$ $cm^{-3}$ or less allows the fractured faces to exhibit relatively low incidental disturbance of the flatness and/or perpendicularity. The material for the support 17 is a gallium nitride-based semiconductor selected from GaN, AlN, AlGaN, InGaN and InAlGaN. The substrate comprising such a gallium nitride-based semiconductor may provide fractured faces 27 and 29 available for a laser cavity. One of an AlN substrate and an AlGaN substrate may provide large polarization and a low refractive index to enhance optical confinement. An InGaN substrate may provide low degree of lattice mismatch between the substrate and the light emitting layer, and high crystal quality.

Figure 6:
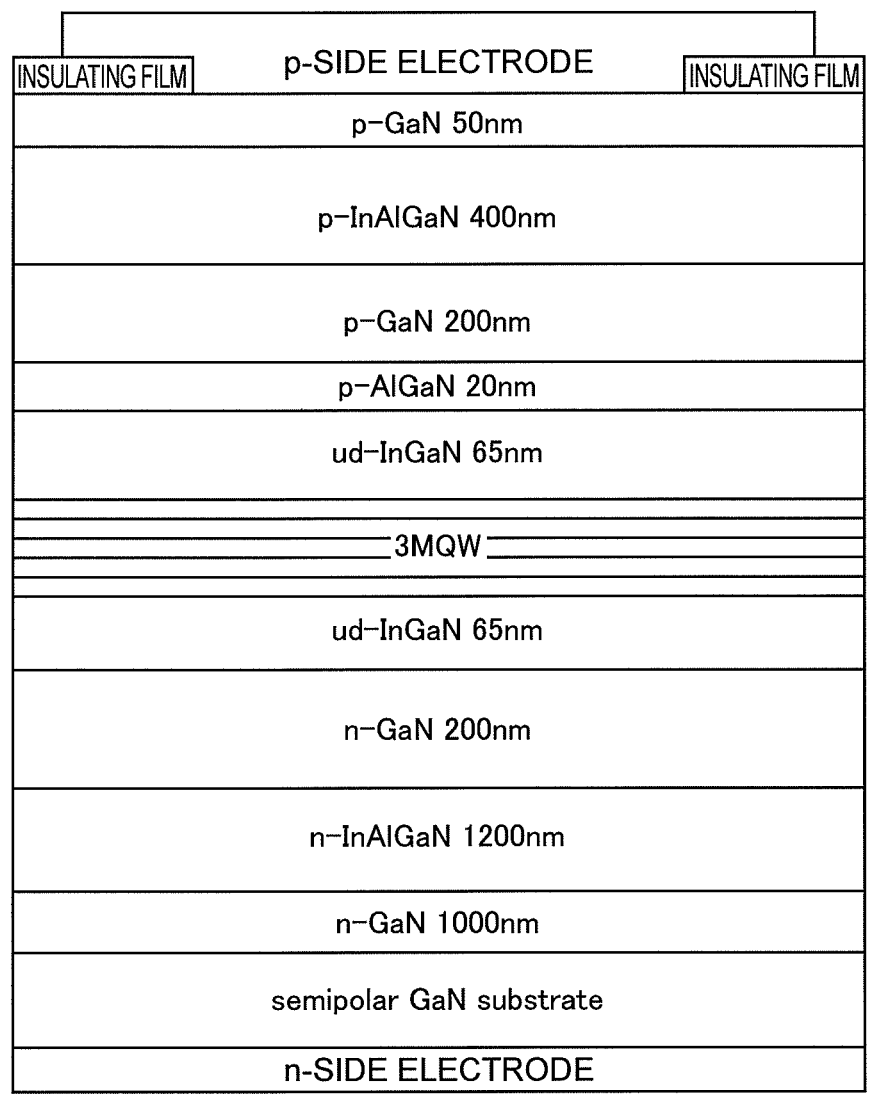
FIG. 6 is a diagram illustrating a typical structure of a group-III nitride semiconductor laser device according to an embodiment.

(Example) A laser diode illustrated in FIG. 6 is fabricated through organometallic vapor phase epitaxy as described below. The laser diode illustrated in FIG. 6 corresponds to the group-III nitride semiconductor laser device 11 illustrated in FIG. 4. The materials for the laser diode are trimethylgallium TMGa, trimethylaluminum TMAl, trimethylindium TMIn, ammonia $NH_3$, and silane $SiH_4$. The substrate is a GaN substrate (corresponding to the substrate Sub and the support 17) having a (20-21) plane as the principal surface. The GaN substrate is sliced from a thick (0001) GaN ingot deposited by HVPE at an angle of 75 degrees toward the m-axis. The substrate is disposed on a susceptor in a reactor to deposit epitaxial layers (corresponding to the semiconductor region Ly and the semiconductor region 19) thereover in the following deposition steps.

An n-type GaN layer (corresponding to the semiconductor layer 20) having a thickness of approximately 1000 nm is deposited. Next, an n-type InAlGaN layer (corresponding to the n-side cladding layer 21) having a thickness approximately 1200 nm functioning as an n-type first cladding layer is deposited thereon. An n-type GaN layer (corresponding to the n-side light guiding layer 35a) having a thickness approximately 200 nm and an undoped InGaN layer (corresponding to the n-side light guiding layer 35b) having a thickness of approximately 65 nm are deposited thereon and then a three-cycle multiple quantum well layer (corresponding to the active layer 25), which comprises GaN layers having a thickness of approximately 15 nm and InGaN layers having a thickness of approximately 3 nm deposited alternately, is grown.

An undoped InGaN layer (corresponding to the p-side light guiding layer 37) having a thickness of approximately 65 nm, a p-type AlGaN layer (corresponding to the p-side block layer 39) having a thickness of approximately 20 nm, and a p-type GaN (corresponding to a p-side light guiding layer 38) having a thickness of approximately 200 nm are deposited in sequence. Next, a p-type InAlGaN layer (corresponding to cladding layer 23) having a thickness of approximately 400 nm and functioning as a p-type second cladding layer is deposited. Then a p-type GaN layer (the contact layer 33) having a thickness of approximately 50 nm is deposited.

An insulating film (corresponding to the insulating film 31) of $SiO_2$ is deposited on the p-type GaN layer having a thickness of approximately 50 nm, and is then etched to form a stripe window having a width of approximately 10 µm by a wet photolithographic process. After the formation of the stripe window, a p-side electrode (corresponding to the p-side electrode 15) of Ni/Au and a pad electrode of Ti/Al are deposited. The back surface (corresponding to the back surface 17b) of the GaN substrate (corresponding to the substrate Sub and the support 17) is mirror-polished with diamond slurry. An n-side electrode of Ti/Al/Ti/Au is formed on the mirror back surface (polished face) by vapor deposition. A substrate product (corresponding to the substrate product 5) is fabricated through the above-described steps.

The laser cavity mirror is fabricated with a laser scriber. A YAG laser having a wavelength of 355 nm is used at an output of 100 mW and a laser scanning rate of 5 mm/s. Scribe marks (corresponding to the scribe marks 5b) are formed with a 400 µm pitch. After the formation of the scribe marks, the substrate product (corresponding to the substrate product 5) is fractured by a cleaving system according to the embodiment to fabricate a laser bar (corresponding to the laser bar 5d). A laser cavity mirror is formed by fracturing.

The substrate product is fractured through the following steps. The substrate product is disposed on the support plate H such that the surface Ha of the support plate H is orthogonal to the direction PR of travel of the blade 5g. Next, the substrate product is fixed on the support plate H such that the endmost scribe mark among the plurality of the scribe marks 5b is located above the space HL and extends along the space HL of the support plate H. The distance between the center of the blade 5g (the reference plane Ab aligned to the edge 5h of the blade 5g) and each of two inside walls of the space HL is approximately 450 µm. The two inside walls extend along the reference plane Ab and orthogonal to the reference axis Aa. Next, the substrate product and the support plate H are tilted at an angle THETA from the m-axis toward the reference plane Ab in the c-m plane. The reference plane Ab is defined by the direction PR of travel of the blade 5g and the a-axis. Next, the blade 5g and the substrate product are positioned such that the scribe mark 5b formed on the surface 5a appeared at the position of the edge 5h of the blade 5g in the display, during the monitoring of the display unit 6c. Next, the blade 5g is forced down through the back surface of the substrate product (corresponding to the back surface 5e of the substrate product 5) to fracture the substrate product, so that a laser bar (corresponding to the laser bar 5d) is separated from the substrate product. The end faces 5f formed by fracturing serve as laser cavity mirrors. The laser bar is then separated into individual group-III nitride semiconductor laser devices (corresponding to the group-III nitride semiconductor laser device 11). The group-III nitride semiconductor laser device has laser cavity mirrors of the fractured faces.

Figure 7:
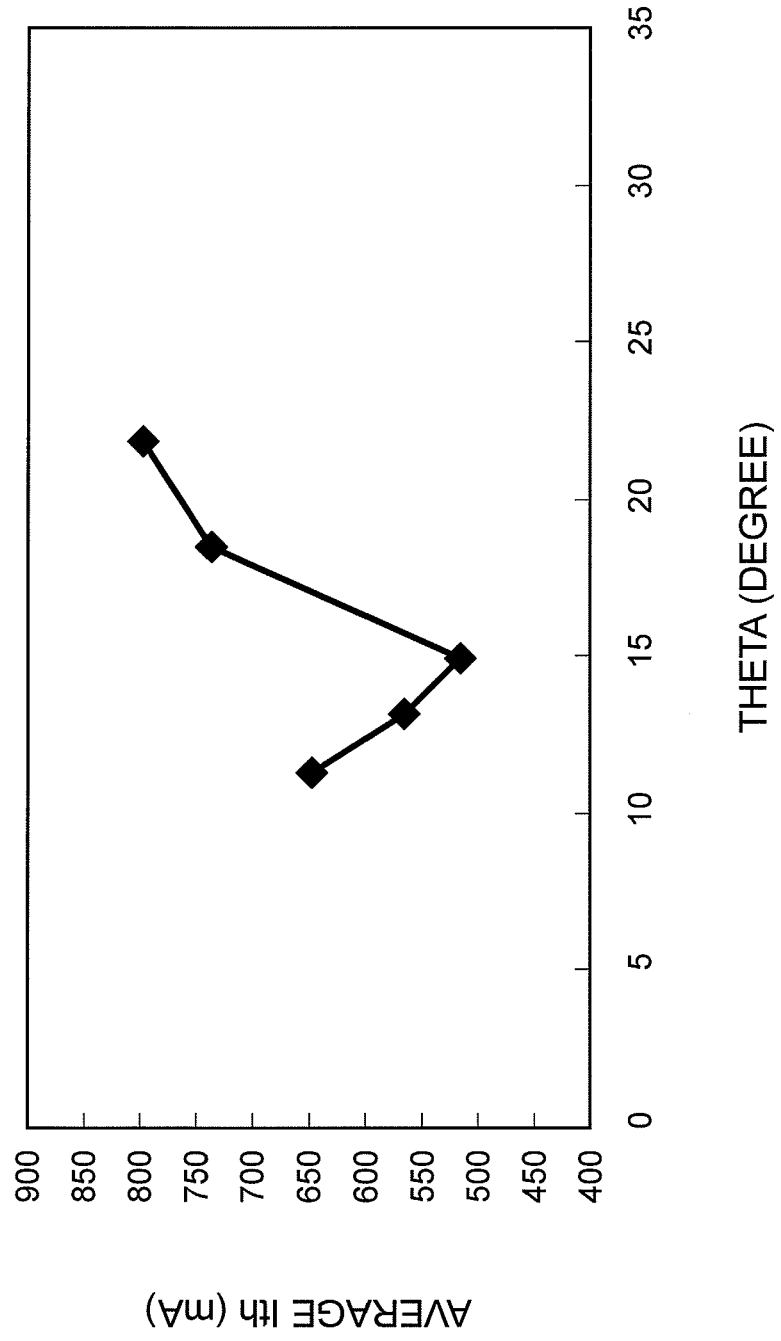
FIG. 7 is a graph representing the correlation between the tilt angle of a support plate and the average value of lasing threshold for explanation of advantages of a method for fabricating a group-III nitride semiconductor laser device according to an embodiment.
Figure 8:
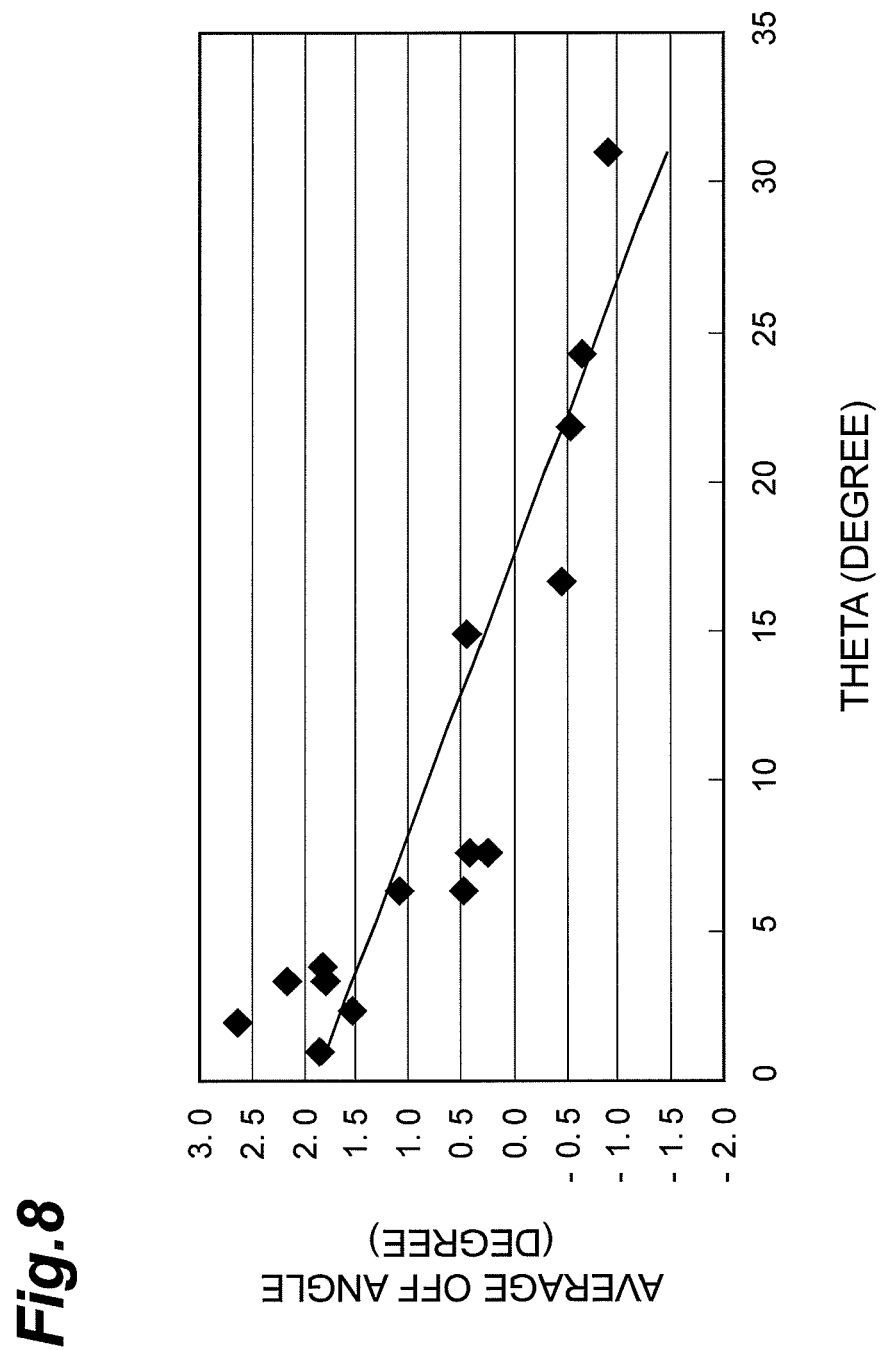
FIG. 8 is a graph representing the correlation between the tilt angle of a support plate and the off angle of an end face for explanation of advantages of a method for fabricating a group-III nitride semiconductor laser device according to an embodiment.

The group-III nitride semiconductor laser devices according to the embodiment are energized to make their evaluation at room temperature. A pulsed power supply having a pulse width 500 ns and a duty ratio of 0.1% is used, and the energization is implemented through probing needles that are in contact with the surface electrodes. In light output measurement, an emission from the end face of the laser bar is detected with a photodiode to obtain a current-light output characteristic (I-L characteristic). FIG. 7 is a graph representing the correlation between the tilt angle (angle THETA) of the support plate H and the average value of lasing threshold Ith (mA) for explanation of advantages of a method for fabricating a group-III nitride semiconductor laser device according to an embodiment. FIG. 8 is a graph representing the correlation between the tilt angle (THETA) of a support plate H and the average off angle (BETA) of end faces fabricated by the separation of the laser bar for explanation of advantages of a method for fabricating a group-III nitride semiconductor laser device according to an embodiment.

FIG. 7 represents the optimum angle THETA for minimization of the average value of the lasing threshold current Ith. The optimum angle THETA approximates to the angle THETA, illustrated in FIG. 8, at which the average off angle BETA of the laser cavity mirror is zero. As the off angle BETA of the resonance mirror increases, the lasing threshold current Ith increases. In other words, the off angle BETA is nearly zero and the lasing threshold current Ith has a minimum value at the optimum angle THETA of the resonance mirror.

Next, the reason for such an optimum angle THETA will now be explained from a crystallographic view. Referring to FIGS. 7 and 8, the optimum angle THETA is approximately 15 degrees, and more specifically, ranges from 11 degrees to 19 degrees. An approximate curve is obtained based on the multiple data points shown in FIG. 8 by a least squares method. The approximate curve is expressed as $X2=-0.11 \times X1+1.89$, where the angle THETA (the horizontal axis of FIG. 8) is X1, while the average off angle BETA (the vertical axis of FIG. 8) is X2. An intersection point of the approximate curve and the horizontal axis (represented by X1), that is, X1 at X2=0, is 17.2 degrees. This demonstrates that the off angle BETA of the laser cavity mirror is nearly zero when the angle THETA is approximately 15 degrees as illustrated in FIG. 7. In a (20-21) substrate tilting at 15 degrees, the c-plane is parallel to the blade (see FIG. 3). Such a configuration facilitates the fracture along the c-plane. In other words, facilitating the fracture along the c-plane by tilting the substrate at the angle THETA of approximately 15 degrees can stably provide high-quality laser cavity mirrors. As described above, FIG. 7 demonstrates that the laser cavity mirror fabricated by the fracture of the substrate tilting at the angle THETA ranging from 11 degrees to 19 degrees achieves lasing pulse, and therefore, such a laser cavity mirror can exhibit sufficient perpendicularity and flatness.

The measurements shown in FIG. 7 are as follows:

| Angle THETA (degree) | Lasing threshold current Ith (mA) |
| --- | --- |
| 11.3 | 648 |
| 13.1 | 566 |
| 14.9 | 517 |
| 18.4 | 737 |
| 21.8 | 796 |

The measurements shown in FIG. 8 are as follows:

| Angle THETA (degree) | Average Off Angle BETA (degree) |
| --- | --- |
| 1.0 | 1.84 |
| 1.9 | 2.64 |
| 2.4 | 1.54 |
| 3.3 | 2.16 |
| 3.3 | 1.79 |
| 3.8 | 1.83 |
| 6.3 | 0.48 |
| 6.3 | 1.08 |
| 7.6 | 0.40 |
| 7.6 | 0.26 |
| 14.9 | 0.45 |

-continued

| Angle THETA (degree) | Average Off Angle BETA (degree) |
|---|---|
| 16.7 | −0.46 |
| 21.8 | −0.55 |
| 24.2 | −0.65 |
| 31.0 | −0.90 |

The method for fabricating a group-III nitride semiconductor laser device having a semi-polar surface according to the embodiment can stably provide a laser cavity mirror which can reduce the lasing threshold current.

The scope of the present invention has been illustrated in the preferred embodiments; however, one skilled in the art should understand that the arrangement and other details of the present invention may be changed without departing from the scope of the invention. The present invention should not be limited to specific configurations described in the embodiments. Accordingly, alteration and modifications made to the claims and the spirit of the invention are included in the scope of the present invention.

What is claimed is:

1. A method for fabricating a group-III nitride semiconductor laser device, comprising the steps of:
   preparing a substrate product having a substrate and a semiconductor region, the substrate comprising a hexagonal group-III nitride semiconductor and including a semi-polar principal surface, the semiconductor region provided on the semi-polar principal surface and including an active layer;
   scribing a first surface of the substrate product to form a plurality of scribe marks extending along an a-axis of the hexagonal group-III nitride semiconductor; and
   forming a laser bar and a substrate product residue from the substrate product with a cleaving system,
   wherein the cleaving system has a support plate supporting the substrate product and a blade forced down through a second surface opposite to the first surface of the substrate product toward the support plate while the substrate product is being supported by the support plate,
   the support plate has a front surface, a back surface opposite to the front surface, and a space extending from the front surface to the back surface,
   the substrate product is placed on the front surface,
   the space extends in the direction orthogonal to a reference axis extending along the front surface of the support plate and defined by the support plate,
   the span of the space in the direction orthogonal to the reference axis is longer than the diameter of the first surface, and
   the step of forming the laser bar and the substrate product residue comprises:
   fixing the substrate product on the support plate such that an endmost scribe mark among the plurality of scribe marks is located above the space and extends along the space;
   tilting the support plate at an angle THETA from an m-axis toward a reference plane defined by the direction of travel of the blade and the a-axis in a c-m plane defined by a c-axis and the m-axis of the hexagonal group-III nitride semiconductor while the direction of travel of the blade is being orthogonal to the front surface of the support plate;
   positioning the blade in the direction orthogonal to the a-axis such that the blade overlaps a plane including an intersection between the endmost scribe mark and the first surface and extending along the direction of travel of the blade; and
   forcing the blade down through the second surface of the substrate product,
   wherein a portion of the second surface extends along the a-axis, and the blade is forced down through the portion of the second surface,
   a c-axis vector indicating the direction of the c-axis tilts at an angle ALPHA from a normal vector of the semi-polar principal surface,
   the angle ALPHA ranges either from 71 degrees to 79 degrees or from 101 degrees to 109 degrees,
   the angle THETA ranges from 11 degrees to 19 degrees,
   the laser bar extends from the first surface to the second surface, and has first and second end faces formed by the separation,
   the first and second end faces intersect the c-m plane, and
   the first and second end faces function as a laser cavity of the group-III nitride semiconductor laser device.

2. The method for fabricating a group-III nitride semiconductor laser device according to claim 1, wherein the scribe marks extend from the first surface toward the second surface along an a-n plane defined by the a-axis and the normal vector.

3. The method for fabricating a group-III nitride semiconductor laser device according to claim 1,
   wherein, in the step for preparing the substrate product, the substrate is subject to a process so as to have a thickness ranging from 50 μm to 100 μm,
   the process is one of slicing and grinding, and
   the second surface is one of a processed surface formed by the process and a surface including an electrode formed on the processed surface.

4. The method for fabricating a group-III nitride semiconductor laser device according to claim 1,
   wherein the scribing is conducted with a laser scriber, and the scribe marks include scribe grooves.

5. The method for fabricating a group-III nitride semiconductor laser device according to claim 1, wherein the semi-polar principal surface tilts at an angle ranging from −4 degrees to +4 degrees from a semi-polar plane corresponding to any one of {20-21} and {20-2-1} planes toward an m-plane.

6. The method for fabricating a group-III nitride semiconductor laser device according to claim 1, wherein the semi-polar principal surface corresponds to any one of {20-21} and {20-2-1} planes.

7. The method for fabricating a group-III nitride semiconductor laser device according to claim 1, wherein the substrate includes any one of GaN, AlGaN, AlN, InGaN, and InAlGaN.

8. The method for fabricating a group-III nitride semiconductor laser device according to claim 1, wherein end faces of the active layer in the first and second end faces tilt at an angle ranging from (ALPHA−5) degrees to (ALPHA+5) degrees from an m-plane orthogonal to an m-axis of the substrate in the c-m plane.

9. The method for fabricating a group-III nitride semiconductor laser device according to claim 2,
   wherein, in the step for preparing the substrate product, the substrate is subject to a process so as to have a thickness ranging from 50 μm to 100 μm,
   the process is one of slicing and grinding, and
   the second surface is one of a processed surface formed by the process and a surface including an electrode formed on the processed surface.

10. The method for fabricating a group-III nitride semiconductor laser device according to claim 2,
wherein the scribing is conducted with a laser scriber, and the scribe marks include scribe grooves.

11. The method for fabricating a group-III nitride semiconductor laser device according to claim 2, wherein the semi-polar principal surface tilts at an angle ranging from −4 degrees to +4 degrees from a semi-polar plane corresponding to any one of {20-21} and {20-2-1} planes toward an m-plane.

12. The method for fabricating a group-III nitride semiconductor laser device according to claim 2, wherein the semi-polar principal surface corresponds to any one of {20-21} and {20-2-1} planes.

13. The method for fabricating a group-III nitride semiconductor laser device according to claim 3,
wherein the scribing is conducted with a laser scriber, and the scribe marks include scribe grooves.

14. The method for fabricating a group-III nitride semiconductor laser device according to claim 3, wherein the semi-polar principal surface tilts at an angle ranging from −4 degrees to +4 degrees from a semi-polar plane corresponding to any one of {20-21} and {20-2-1} planes toward an m-plane.

15. The method for fabricating a group-III nitride semiconductor laser device according to claim 3, wherein the semi-polar principal surface corresponds to any one of {20-21} and {20-2-1} planes.

16. The method for fabricating a group-III nitride semiconductor laser device according to claim 4, wherein the semi-polar principal surface tilts at an angle ranging from −4 degrees to +4 degrees from a semi-polar plane corresponding to any one of {20-21} and {20-2-1} planes toward an m-plane.

17. The method for fabricating a group-III nitride semiconductor laser device according to claim 4, wherein the semi-polar principal surface corresponds to any one of {20-21} and {20-2-1} planes.

18. The method for fabricating a group-III nitride semiconductor laser device according to claim 5, wherein the semi-polar principal surface corresponds to any one of {20-21} and {20-2-1} planes.

19. The method for fabricating a group-III nitride semiconductor laser device according to claim 8, wherein, in a plane orthogonal to the c-m plane and the normal vector, end faces of the active layer tilt by an angle ranging from −5 degrees to +5 degrees from a plane orthogonal to the intersection line between the plane and the c-m plane.

* * * * *